United States Patent
Lung et al.

(10) Patent No.: US 6,255,032 B1
(45) Date of Patent: Jul. 3, 2001

(54) CHEMICALLY AMPLIFIED COLOR RESIST COMPOSITION

(75) Inventors: Wu Jung Lung; Chien Shien Wen; Fan Jr Cheng; Lee Rong Jer, all of Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/447,469

(22) Filed: Nov. 22, 1999

(51) Int. Cl.$^7$ .................................................. G03F 7/004
(52) U.S. Cl. ............................ 430/270.1; 430/7; 430/914
(58) Field of Search ............................... 430/270.1, 7, 914

(56) References Cited

U.S. PATENT DOCUMENTS 6,087,050 * 7/2000 Itano et al. .............................. 430/7

FOREIGN PATENT DOCUMENTS

701171 * 3/1996 (EP) .

* cited by examiner

Primary Examiner—Rosemary E. Ashton
(74) Attorney, Agent, or Firm—W. Wayne Liauh

(57) ABSTRACT

An active matrix liquid crystal display (AMLCD) with improved pixel aperture and long term stability. It contains: (a) a substantially transparent substrate; (b) an array of thin film transistors (TFT) on the substrate; (c) a photo imageable color filter formed on the each of the TFTs. The photo imageable color filter contains: (i) a substantially transparent acrylic copolymer containing 1–15 mol % of carboxyl groups, 1–15 mol % of hydroxyl groups, 30–50 mol % tertiary butyl ester groups, and 5–20 mol % phenyl groups; (ii) an organic pigment; and (iii) a photo acid generator and a photo sensitizer. The acrylic copolymer allows the polymer molecules to fully extend and provides improved affinity with the color pigments, so as to allow improved long term stability of the color filters to be obtained by preventing the coagulation and/or precipitation of the pigment particles, which will cause the properties of the color filter, such as light transmissibility, color saturation, and color hue, to degrade.

9 Claims, No Drawings

CHEMICALLY AMPLIFIED COLOR RESIST COMPOSITION

FIELD OF THE INVENTION

The present invention relates to an improved color filter membrane to be applied on top of a thin film transistor (TFT) structure as a part of an active matrix crystal liquid display (AMCLD). More specifically, the present invention relates to an improved substantially transparent resin composition containing at least an acrylic copolymer, at least one organic color pigment, and at least one photo acid generator, for forming an imageable color filter membrane for use in manufacturing AMLCDs. The color photoresist, or color resist, disclosed in the present invention exhibits long term stability of the pigment particles without showing any precipitation or coagulation problems. The color photoresist of the present invention also exhibits excellent photosensitivity, color saturation, color hue, resolution, and heat- and chemical-resistance, and these advantageous properties will not degrade with time. As a result, the color photoresist of the present invention can be advantageously used in improving the pixel aperture ratio of an active matrix crystal liquid display, and enhancing the property and value thereof. The present invention also relates to the improved active matrix crystal liquid display incorporating the novel color resist.

BACKGROUND OF THE INVENTION

Liquid crystal displays (LCD) have become an increasingly important device in today's computer age. LCDs have several distinct advantages over CRTs, including the absence of radiation and substantially lower power consumption. Because of their better brightness and wider viewing angle, active matrix liquid crystal displays (AMLCD) have become the preferred mode of LCDs. An AMLCD generally comprises a plurality of rows and columns of address lines which cross at an angle to one another to thereby form a plurality of crossover points. A pixel is an array element associated with each crossover point which can be selectively addressed. Typically a switching device such as a thin film transistor (TFT) is associated with each array element or pixel. The switching devices allow the individual pixels to be selectively addressed by the application of suitable voltage between respective pairs of row and column address lines, so as to allow images to be shown on the screen.

A TFT generally contains a pair of substantially co-planar source and drain electrodes, a thin film semiconductor material disposed between the source and drain electrodes, and a gate electrode in proximity to the semiconductor but electrically insulated therefrom by a gate insulator. An application of voltage to the gate electrode controls the current flow through the TFT between the pair of source and drain electrodes. This causes the associated pixel of an AMLCD to be switched on and off. Typically, the pixel aperture ratio (i.e., pixel opening relative to the area occupied by a TFT) in an non-overlaying AMLCD is about 50% or less. This causes limited display luminance or large consumption of backlight power. In order to improve battery life, it is highly desirable to increase the pixel aperture ratio. The higher the pixel aperture ratio, the better the display transmission and the longer the batter life for a given luminance.

U.S. Pat. No. 5,780,871, the content thereof is incorporated therein by reference, discloses a high aperture LCD, which contains an array of substantially transparent pixel electrodes which overlap at least one of the address lines to increase the pixel aperture ratios of the LCD. A substantially transparent photo-imageable insulating layer (i.e., photoresist) is disposed between the address lines and the pixel electrodes in the areas of overlap and areas adjacent source electrodes. The photo-imageable insulating layer has a first group of contact vias defined therein by photo-imaging, wherein the pixel electrodes are in electrical communication with corresponding TFT source electrodes through the contact vias of the first defined in the insulating layer.

In theory, it should be possible to apply the device developed in the '871 patent to color LCDs by using a set of color photo-imageable insulating materials. However, attempts to do so have failed, mainly due to the lack of success in finding a suitable color resist which can provide the desired properties, particularly long term stability, for use as a color photo-imageable insulating layer so as to serve as an appropriate color filter.

A good color filter requires good light transmissiblility and color saturation. Both of these properties are closely related to the particle size and uniformity of the coloring materials. Conventionally dyes have been used which satisfy the light transmissiblility and color saturation requirements. However, because of their relatively poor light and heat stability, dyes are not considered desirable coloring material for making color filters. Color filters made using color dyes as the color material have not been shown to provide a long enough useful life.

More recently, pigments, which exhibit substantially improved light and heat resistance, have been used replacing dyes in making color filters. However, in order to achieve satisfactory light transmissiblility and color saturation, the pigments must be very small in size and they also must be homogeneously dispersed in the filter medium. Typically, the particle size of the pigments must be smaller than one-half of the wavelength at which they are expected to operate. The wavelengths of red, green, and blue lights are 610 nm, 540 nm, and 450 nm, respectively. Thus, the particle sizes of the associated pigments must be less than 0.3 $\mu$m, 0.27 $\mu$m, and 0.23 $\mu$m, respectively. Because most pigments, especially organic pigments, have low extent of polarity at their surface and are of relatively high molecular weight molecules, they do not exhibit good affinity with the polymer resin, which makes the bulk of the color filter, or the organic solvent, which is used to coat the polymer resin on the substrate. Both the polymer resin and the organic solvent are relatively highly polar compounds. As a results, the pigments in the color filters tend to coagulate with time and form relatively large particles, causing degradations in the color saturation, color hue, and light transmissibility. This problem becomes even more profound when attempting to use pigments in color resists, which contain further foreign compounds in order to achieve photo imageability.

Because AMLCDs are becoming increasingly important, it is highly desirable to develop a suitable color resist with good color saturation, resolution, light transmissibility, and, more importantly, long term stability, so that it can be advantageously used to provide AMLCDs with increased pixel aperture ratio. Of course, such improved color resist, when developed, will also be very useful in other applications.

SUMMARY OF THE INVENTION

The primary object of the present invention is to develop an improved color resist with desirable color saturation, resolution, light transmissibility, and long term chemical and heat stability, so that it can be advantageously utilized as color filters in conjunction with a photolithography process, for the manufacturing of active matrix liquid crystal displays (AMLCDs) with increased pixel ratio. More specifically, the primary object of the present invention is to develop an improved color resist composition containing at least one light-transmitting polymer resin, at least one pigment, and at least one photoacid generator so as to allow the preparation of a color filter with excellent color saturation, resolution, light transmission, heat and light resistance, and photo imageability utilizing a photolithography process.

As discussed above, the inventors have found that most commercially available pigments are relatively high molecular weight molecules and have low surface polarity. As a result, they do not possess good compatibility with the highly polar polymer resin and the organic solvent which is used to cost the polymer resin on a semiconductor surface, and the pigments in the color filters tend to coagulate with time and form relatively large particles, or precipitate, causing degradations in the color saturation, color hue, and light transmissibility. This problem becomes even more profound when attempting to use pigments to form color resists, which contain additional foreign materials in order to achieve photo imageability.

The improved color resist composition disclosed in the present invention comprises:

(1) A substantially transparent acrylic polymer containing at least one carboxyl group, at least one hydroxyl group, at least one ester group, and at least one phenyl group;

(2) A pigment; and (3) A photoacid generator.

Other compounds, such as a sensitizer, which absorbs irradiated energy and transfers the absorbed energy to the photoacid generator, and a surface active agent, may also be included in the color resist composition.

The acrylic polymer used in the present invention is prepared from a reaction mixture that contains 1–15 mol % hydroxyl group containing monomer, 1–15 mol % carboxyl group containing monomer, 30–50 mol % tertiary butyl ester group contain monomer, and 5–20 mol % phenyl group containing monomer.

The hydroxyl group-containing monomer can be any unsaturated monomer that contains a hydroxyl group. Preferably, the hydroxyl group-containing monomer for use in the present invention is a hydroxy-substituted acrylic ester or hydroxy-substituted methyl acrylic ester. More preferable, the hydroxy group-containing monomer is 2-hydroxy-ethyl acrylic ester, 2-hydroxy-ethyl methacrylic ester, hydroxy-propyl acrylic ester, hydroxy-propylmethyl acrylic ester, hydroxy-butyl acrylic ester, or hydroxy-butylmethyl acrylic ester.

The carboxyl group-containing monomer can be any unsaturated monomer that contains a carboxyl group. Preferably, the carboxyl group-containing monomer for use in the present invention is acrylic acid, methacrylic acid, cis-1,2-ethylenedicarboxylic acid (maleic acid), crotonic acid, methylene succinic acid, titanic methacrylic ester, ethylenedicarboxylic methacrylic ester, or β-carboxy-ethyl methacrylic ester.

The tertiary butyl ester group-containing monomer can be any unsaturated monomer that contains a tertiary butyl ester group. Preferably, the tertiary butyl ester group containing monomer for use in the present invention is tertiary butyl acrylic ester, tertiary butyl methacrylic ester, tertiary butyl acrylic ester, tertiary butoxycarbonyloxy styrene, tertiary butoxycarbonyloxy methyl styrene, tertiary butoxycarbonyloxy allyl ether, or tertiary butoxycarbonyloxy vinyl ether.

The phenyl group-containing monomer can be any unsaturated monomer that contains a phenyl group. Preferably, the phenyl group-containing monomer for use in the present invention is benzyl acrylic ester, benzyl methacrylic ester, phenyl acrylic ester, or phenyl methacrylic ester.

Other unsaturated monomers not mentioned above can also be included in the polymerization mixture. Examples of these monomers include acrylic acid type monomer, preferably methacrylate, methyl methacrylate, ethyl acrylate, ethyl methacrylate, acrylic acid n-butylate, n-butyl methacrylate, 2-ethylhexyl acrylic ester, etc. After appropriate amounts of these monomers are mixed together, the final polymer can be prepared using any conventional polymerization method, such as anionic, cationic, or free radical addition polymerization techniques.

It was found by the co-inventors of the present invention that the presence of hydroxyl groups in the polymer causes the polymer molecule to be more fully extended and form steric hindrance. This prevents pigment particles from coagulating and/or precipitating. The hydroxyl groups also participate in the cross-linking process during the curing of the color filter resin. The co-inventors also discovered that if the amount of the hydroxyl groups is too low, there will not be enough cross-linking, causing inadequate hardness and poor resistance to chemical attacks. However, if the amount of hydroxyl groups is too high, the resultant polymer will not provide good wrapping ability around the pigment, causing inadequate dispersion of the pigments and thus large pigment particle size. The carboxyl groups contained in the polymer help the polymer to emulsify in the presence of water molecules.

The phenyl groups impart good affinity with the pigment particles, thus allowing the surface of the pigment to be quickly wetted by the polymer molecules, and causing the pigment particle to be more easily absorbed by the polymer molecules. This tends to provide a stabilizing effect on the pigment particles and prevent coagulation to occur. If the amount of the phenyl groups is too low, the resultant polymer will not be able to cause the pigments to be effectively dispersed. On the other hand, if the amount of the phenyl groups is too high, there will be too much affinity between the pigments and the polymer. This will hinder the polymer molecules to fully expand, and, consequently, adversely affect the stabilizing effect provided by the polymer and result in eventual precipitation of the pigment particles.

A wide variety of pigments can be used in the present invention. Preferably, the pigments are organic pigments such as azo, anthraquinone, phthalocyanine, Perylene, thioinding, and halogenated phthalocyanine compounds, and their derivatives. Based on their color index (CI No.), preferred pigments include Pigment Red 9, 122, 123, 147, 155, 168, 177, 180, 217, 220, 224, 254, Pigment Yellow 20, 24, 83, 93, 109, 110, 117, 125, 138, 139, 147, 150, 154; Pigment Green 7, 36; Pigment Blue 15, 15:3, 15:4, 15:6, 22, 60; Pigment Violet 19, 23, 29, 37, 50, etc. Yellow pigment can be used as a complement to the red and green photosensitive compositions; the ratio between yellow and red or yellow and green pigments should be less than 50 wt %. Likewise, violet pigment can be used as a complement to the blue photosensitive composition, and the ratio between violet and blue pigments should be less than 50 wt %.

Since the color filter of the present invention is to be used as a color photoresist and be patterned by a photolithography process, resolution of the photo-imageable composition is also a very important consideration. The acrylic polymer so used must also be compatible with photo imageable compounds. It is also preferable to use a photo acid generator and a photo sensitizer to impart the photo imageability for the color resin. Preferred photo acid generators include diaryl iodonium hexafluoroantimonate, triaryl sulfonium hexafluoroantimonate, diaryl sulfonium hexafluorophosphate. Preferred photo sensitizers include anthracene, derivatives of anthracene, 1-hydroxycyclohexyl phenyl ketone, or analogs thereof.

The color resin composition is typically dissolved in an organic solvent before it is applied onto the semiconductor substrate. Preferred organic solvents include cyclohexanone, ethylene glycol monomethyl ether, ethylene glycol monoethyl ether, ethylene glycol monobutyl ether, ethylene glycol monoalkyl ether acetates, propylene glycol monomethyl ether acetate, ethyl-2-ethoxy ethanol acetate, 3-ethoxypropionic acid butyl ester, or 3-methoxy monobutyl acetate.

DETAILED DESCRIPTION OF THE PREFERRED EMBODIMENT

The present invention discloses an improved color resist with excellent color saturation, resolution, light transmissibility, as well as excellent heat and chemical resistance, so that it can be advantageously utilized as a photo imageable color filter in conjunction with a photolithography process for the manufacturing of active matrix liquid crystal displays (AMLCDs) with increased pixel aperture ratio.

In the present invention, an improved substantially transparent acrylic polymer is disclosed which excellent compatibility with many commercially available pigments, which are of high molecular weight molecules and have low surface polarity, even in the presence of other chemical compounds such as photo acid generator and photo sensitizer. The color filters of the present invention also exhibit excellent color saturation, color hue, and allow the pigment particles to exhibit excellent long term stability without coagulation or precipitations into large particles. Coagulation and/or precipitation of pigment particles can cause the light-transmitting and color properties of the color filters to degrade.

The improved color resist composition disclosed in the present invention comprises:

(1) A substantially transparent acrylic polymer which is a copolymer containing 1–15 mol % of carboxyl groups, 1–15 mol % of hydroxyl groups, 30–50 mol % tertiary butyl ester groups, and 5–20 mol % phenyl groups;

(2) An organic pigment; and (3) A photo acid generator.

Other compounds, such as a sensitizer and a surface active agent, may also be included in the color resist composition. The sensitizer absorbs the irradiated energy and transfers the absorbed energy to the photo acid generator to facilitate the photo imaging process.

The acrylic polymer used in the present invention is prepared from a reaction mixture that contains 1–15 mol % hydroxyl group containing monomers, 1–15 mol % carboxyl group containing monomers, 30–50 mol % tertiary butyl ester group contain monomers, and 5–20 mol % phenyl group containing monomers. The hydroxyl group containing monomer can be any unsaturated monomer that contains a hydroxyl group. Preferably, the hydroxyl group containing monomer for use in the present invention is a hydroxy-substituted acrylic ester or hydroxy-substituted methyl acrylic ester. More preferable, the hydroxy group containing monomer is 2-hydroxy-ethyl acrylic ester, 2-hydroxy-ethyl methacrylic ester, hydroxy-propyl acrylic ester, hydroxy-propylmethyl acrylic ester, hydroxy-butyl acrylic ester, or hydroxy-butylmethyl acrylic ester.

The carboxyl group containing monomer can be any unsaturated monomer that contains a carboxyl group. Preferably, the carboxyl group containing monomer for use in the present invention is acrylic acid, methacrylic acid, cis-1,2-ethylenedicarboxylic acid (maleic acid), crotonic acid, mthylene succinic acid, titanic methacrylic ester, ethylenedicarboxylic methacrylic ester, or β-carboxy-ethyl methacrylic ester.

The tertiary butyl ester group containing monomer can be any unsaturated monomer that contains a tertiary butyl ester group. Preferably, the tertiary butyl ester group containing monomer for use in the present invention is tertiary butyl acrylic ester, tertiary butyl methacrylic ester, tertiary butyl acrylic ester, tertiary butoxycarbonyloxy styrene, tertiary butoxycarbonyloxy methyl styrene, tertiary butoxycarbonyloxy allyl ether, tertiary butoxycarbonyloxy vinyl ether The phenyl group containing monomer can be any unsaturated monomer that contains a phenyl group. Preferably, the phenyl group containing monomer for use in the present invention is benzyl acrylic ester, benzyl methacrylic ester, phenyl acrylic ester, or phenyl methacrylic ester.

Other unsaturated monomers not mentioned above can also be included in the polymerization mixture. Examples of these monomers include acrylic acid monomer, preferably methacrylate methyl methacrylate, ethyl acrylate, ethyl methacrylate, acrylic acid n-butylate, n-butyl methacrylate, 2-ethylhexyl acrylic ester, etc. After the respective monomers are added and mixed, the final polymer can be prepared using any conventional polymerization method, such as anionic, cationic, or free radical addition polymerization techniques.

Excellent results were obtained from the novel combination of the color resist composition of the present invention. The presence of hydroxyl groups in the polymer allows the polymer molecule to more fully extend and form steric hindrance, which helps to prevent the pigment particles from coagulating and/or precipitating. The hydroxyl groups also participate in the crosslinking process during the curing of the color filter. The co-inventors discovered that if the amount of hydroxyl groups is too low, there wouldn't be enough cross-linking of the resultant polymer, causing inadequate hardness and poor resistance to chemical attacks. However, if the amount of hydroxyl groups is too large, the resultant polymer will not provide good wrapping around the pigment, causing an inadequate dispersion of the pigments and thus increasing the pigment particle size. The carboxyl groups contained in the polymer help the polymer to emulsify in an aqueous solution.

On the other hand, the phenyl groups impart good affinity with the pigment particles, allowing the surface of the pigment to be quickly wetted by the polymer molecules, and thus causing the pigment particle to be more easily absorbed by the polymer molecules. This tends to provide a stabilizing effect on the pigment particles and also prevents coagulation from occurring. If the amount of the phenyl groups is too low, the resultant polymer will not be able to cause the pigments to be effectively dispersed. On the other hand, if the amount of the phenyl groups is too high, there will be too much affinity between the pigments and the polymer, causing the polymer molecule to be unable to fully expand. This will adversely affect the stabilizing effect provided by the polymer and result in eventual precipitation of the pigment particles.

A wide variety of pigments can be used in the present invention. Preferably, the pigments are organic pigments such as azo, anthraquinone, phthalocyanine, Perylene, thioinding, and halogenated phthalocyanine compounds, and their derivatives. Based on their color index (CI No.), preferred pigments include Pigment Red 9, 122, 123, 147, 155, 168, 177, 180, 217, 220, 224, 254, Pigment Yellow 20, 24, 83, 93, 109, 110, 117, 125, 138, 139, 147, 150, 154; Pigment Green 7, 36; Pigment Blue 15, 15:3, 15:4, 15:6, 22, 60; Pigment Violet 19, 23, 29, 37, 50, etc. Yellow pigment can be used as a complement to the red and green photosensitive compositions; the ratio between yellow and red or yellow and green pigments should be less than 50 wt %. Likewise, violet pigment can be used as a complement to the blue photosensitive composition, and the ratio between violet and blue pigments should be less than 50 wt %.

Since the color filter of the present invention is to be used as a color photoresist and be defined by a photolithography process, resolution of the photo-imageable composition is also a very important consideration. In addition to using the acrylic polymer disclosed above, it is also preferable to use a photo acid generator and a photo sensitizer as the polymerization initiator. Preferred photo acid generators include diaryl iodonium hexafluoroantimonate, triaryl sulfonium hexafluoroantimonate, diaryl sulfonium hexafluorophosphate. Preferred photo sensitizers include anthracene, derivatives of anthracene, 1-hydroxycyclohexyl phenyl ketone, or analogs thereof.

The pigment composition can be first dissolved in an organic solvent. Preferred organic solvents include cyclohexanone, ethylene glycol monomethyl ether, ethylene glycol monoethyl ether, ethylene glycol monobutyl ether, ethylene glycol monoalkyl ether acetates, propylene glycol monomethyl ether acetate, ethyl-2-ethoxy ethanol acetate, 3-ethoxypropionic acid butyl ester, or 3-methoxy monobutyl acetate.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A polymerization reaction mixture was prepared which contained the following acrylic monomers: 5 parts of 2-hydroxy-ethyl methacrylic ester, 10 parts of methacrylic acid, 50 parts of tertiary butyl methacrylic ester, and 35 parts of benzyl methacrylic ester. The above monomers were dissolved in PGMEA solvent to form a 40 wt % solution. Thereafter, 0.25 wt % of a photo polymerization initiator AIBN was added to the reaction mixture under nitrogen, and the reaction continued at 80° C. for five hours to copolymerize the acrylic monomers. At the end of the reaction, the product resin was diluted with PGMEA solvent to 20 wt %.

Three different color resist compositions were separately prepared, each contained 6 g of a color generating composition, 2 g of a dispersant, and 92 g of the diluted polymer solution prepared above. For the red color resist, the red color generating composition contained CI Pigment Red 177 and CI Pigment Yellow 150 in a weight ratio of 5:1. The dispersant contained BYK 161. For the green color resist, the green color generating composition contained CI Pigment Green 36 and CI Pigment Yellow 150 in a weight ratio of 4:1. The dispersant contained Solsperse 24000 and Slosperse 5000. For the blue color resist, the blue color generating composition contained CI Pigment Blue 15:6 and CI Pigment Violet 23 in a weight ratio of 14:1. The dispersant contained Solsperse 24000 and Slosperse 5000.

Then, 5 g of a photo acid generator, diaryl iodonium hexafluoroantimonate, and 2 g of a photo sensitizer, 1-hydroxycyclohexyl phenyl ketone, were added to 100 g of each of the color resist compositions, which were thoroughly mixed with a milling machine to form red, green, and blue color resist compositions, respectively.

One of the color resist compositions, for example, the red color resist composition, was spin coated at 800 rpm onto an array of TFTs that had been formed on a glass substrate, which was then baked at 90° C. for 10 minutes. Thereafter, the color resist was exposed to a extra-high pressure mercury lamp at an exposure density of 800 mj/cm$^2$ under a photomask, followed by baking at 130° C. for 10 minutes to accelerate the exposure reaction. The photomask had a pattern with varying degrees of resolutions. After the light exposure, the color resist was selectively and chemically developed using a 2.5% TMAH (tetramethylammonium hydroxide). This caused a repeated but non-contiguous red color filter pattern to remain on the substrate covering about one-third of the TFTs in total areas. After rinsing with de-ionized water, the substrate was baked again at 200° C. for 40 minutes to allow the red filter pattern to more firmly bonded to the substrate surface. The same procedure was repeated for the green and blue color filter patterns, respectively, to form a composite RGM color filter.

The RGB color filter was tested under 250° C. for 50 minutes and it demonstrated excellent stability. It also exhibited excellent dielectric constant (<3.5), as well as having a resolution better than 5 $\mu$m. The red, green, and blue transmissibilities were measured to be 95%, 80%, and 80%, respectively, at a thickness of 2 $\mu$m.

EXAMPLE 2

A second polymerization reaction mixture was prepared which contained the following acrylic monomers: 10 parts of 2-hydroxy-ethyl methacrylic ester, 20 parts of acrylic acid, 40 parts of tertiary butyl methacrylic ester, and 30 parts of benzyl methacrylic ester. The above monomers were dissolved in PGMEA solvent to form a 40 wt % solution. Thereafter, 0.25 wt % of a photo polymerization initiator AIBN was added to the reaction mixture under nitrogen, and the reaction continued at 80° C. for five hours to copolymerize the acrylic monomers. At the end of the reaction, the product resin was diluted with PGMEA solvent to 20 wt %.

Three different color resist compositions were separately prepared, each contained 7 g of a color generating composition, 1 g of a dispersant, and 92 g of the diluted polymer resin solution prepared above. For the red color resist, the red color generating composition contained CI Pigment Red 177 and CI Pigment Yellow 150 in a weight ratio of 5:1. The dispersant contained BYK 161. For the green color resist, the green color generating composition contained CI Pigment Green 36 and CI Pigment Yellow 150 in a weight ratio of 4:1. The dispersant contained Solsperse 24000 and Slosperse 5000. For the blue color resist, the blue color generating composition contained Cl Pigment Blue 15:6 and CI Pigment Violet 23 in a weight ratio of 14:1. The dispersant contained Solsperse 24000 and Slosperse 5000.

Then, 5 g of a photo acid generator, triaryl sulfonium hexafluorophosphate, and a photo sensitizer, which contained a mixture of 0.3 g of anthracene and 2 g of 1-hydroxycyclohexyl phenyl ketone, were added to 100 g of each of the color resist compositions which were thoroughly mixed with a milling machine to form red, green, and blue color resist compositions, respectively.

One of the color resist compositions, for example, the red color resist composition, was spin coated at 800 rpm onto an array of TFTs that had been formed on a glass substrate, which was then baked at 90° C. for 10 minutes. Thereafter, the color resist was exposed to a extra-high pressure mercury lamp at an exposure density of 800 mj/cm$^2$ under a photomask, followed by baking at 130° C. for 10 minutes to accelerate the exposure reaction. The photomask had a pattern with varying degrees of resolutions. After the light exposure, the color resist was selectively and chemically developed using a 2.5% TMAH (tetramethylammonium hydroxide). This caused a repeated but noncontiguous red color filter pattern to be left on the substrate covering about one-third of the TFTs.

After rinsing with de-ionized water, the substrate was baked again at 200° C. for 40 minutes to allow the red filter pattern to more firmed affixed to the substrate surface. The same procedure was repeated for the green and blue color filter patterns, respectively, to form a composite RGM color filter.

The RGB color filter was tested under 250° C. for 50 minutes and it demonstrated excellent stability. It also exhibited excellent dielectric constant (<3.5), as well as having a resolution better than 5 μm. The red, green, and blue transmissibilities were measured to be 95%, 77%, and 77%, respectively, at a thickness of 2 μm.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A color resist composition comprising:
   (a) a substantially transparent acrylic polymer which is a copolymer containing 1–5 mol % of carboxyl groups, 1–15 mol % of hydroxyl groups, 30–50 mol % tertiary butyl ester groups, and 5–20 mol % phenyl groups;
   (b) an organic pigment; and
   (c) a photo acid generator.

2. The color resist composition according to claim 1, wherein said hydroxyl groups are formed from a hydroxyl group-containing monomer which is either a hydroxy-substituted acrylic ester or a hydroxy-substituted methacrylic ester.

3. The color resist composition according to claim 1, wherein said hydroxyl groups are formed from hydroxyl group-containing monomers which are selected from the group consisting of 2-hydroxy-ethyl acrylic ester, 2-hydroxy-ethyl methacrylic ester, hydroxy-propyl acrylic ester, hydroxy-propylmethyl acrylic ester, hydroxy-butyl acrylic ester, and hydroxy-butylmethyl acrylic ester.

4. The color resist composition according to claim 1, wherein said carboxyl groups are formed from carboxyl group-containing monomer which are selected from the group consisting of acrylic acid, methacrylic acid, cis-1,2-ethylenedicarboxylic acid (maleic acid), crotonic acid, mthylene succinic acid, titanic methacrylic ester, ethylenedicarboxylic methacrylic ester, and β-carboxy-ethyl methacrylic ester.

5. The color resist composition according to claim 1, wherein said tertiary butyl ester groups are formed from tertiary butyl ester group-containing monomers which are selected from the group consisting of tertiary butyl acrylic ester, tertiary butyl methacrylic ester, tertiary butyl acrylic ester, tertiary butoxycarbonyloxy styrene, tertiary butoxycarbonyloxy methyl styrene, tertiary butoxycarbonyloxy allyl ether, and tertiary butoxycarbonyloxy vinyl ether.

6. The color resist composition according to claim 1, wherein said phenyl groups are formed from phenyl group-containing monomers which are selected from the group consisting of benzyl acrylic ester, benzyl methacrylic ester, phenyl acrylic ester, or phenyl methacrylic ester.

7. The color resist composition according to claim 1, wherein said photo acid generator is selected from the group consisting of diaryl iodonium hexafluoroantimonate, triaryl sulfonium hexafluoroantimonate, and diaryl sulfonium hexafluorophosphate.

8. The color resist composition according to claim 1 which further comprises a photo sensitizer.

9. The color resist composition according to claim 1 which further comprises a photo sensitizer selected from the group consisting of anthracene, 1-hydroxycyclohexyl phenyl ketone, and derivatives thereof.

* * * * *